United States Patent
Nobekawa

(10) Patent No.: US 7,765,446 B2
(45) Date of Patent: Jul. 27, 2010

(54) METHOD FOR TESTING SEMICONDUCTOR INTEGRATED CIRCUIT AND METHOD FOR VERIFYING DESIGN RULES

(75) Inventor: Tomoko Nobekawa, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/430,584

(22) Filed: Apr. 27, 2009

(65) Prior Publication Data
US 2009/0265593 A1    Oct. 22, 2009

Related U.S. Application Data

(62) Division of application No. 11/445,195, filed on Jun. 2, 2006, now Pat. No. 7,543,206.

(30) Foreign Application Priority Data
Nov. 18, 2005    (JP) .............................. 2005-334437

(51) Int. Cl.
   *G01R 31/28*    (2006.01)

(52) U.S. Cl. ..................................................... 714/726
(58) Field of Classification Search .................. 714/726
   See application file for complete search history.

(56) References Cited

U.S. PATENT DOCUMENTS

| 7,181,664 B2 * | 2/2007 | Lee et al. ................... 714/726 |
| 2002/0124218 A1 | 9/2002 | Kishimoto |
| 2005/0193300 A1 | 9/2005 | Matsumoto et al. |
| 2006/0282727 A1 * | 12/2006 | Hoshaku ..................... 714/726 |

FOREIGN PATENT DOCUMENTS

JP    2002257903    9/2002

* cited by examiner

*Primary Examiner*—James C Kerveros
(74) *Attorney, Agent, or Firm*—Dickinson Wright PLLC

(57) ABSTRACT

A method is provided for testing a semiconductor integrated circuit by utilizing a scan path circuit provided to detect the degeneracy fault in the semiconductor integrated circuit, and bringing scan chains to states in which shift resistor operations can be effected for the input of patterns by which a glitch fault and the IR-DROP fault between the scan chains can be detected.

3 Claims, 9 Drawing Sheets

METHOD FOR TESTING SEMICONDUCTOR INTEGRATED CIRCUIT AND METHOD FOR VERIFYING DESIGN RULES

CROSS REFERENCE TO RELATED APPLICATIONS

This application is a divisional of application Ser. No. 11/445,195, filed Jun. 2, 2006, now U.S. Pat. No. 7,543,206, which claims priority under 35 USC 119 based on Japanese Application No. 2005-334437 filed Nov. 18, 2005, the entire contents of each of which are incorporated by reference.

BACKGROUND OF THE INVENTION

1. Field of the Invention

The present invention relates to a method for testing a semiconductor integrated circuit used for evaluating the finished quality of the semiconductor integrated circuit and to a method for verifying design rules.

2. Description of the Related Art

As a conventional method for evaluating the finished quality of a semiconductor integrated circuit, measurement conducted by using PCMs (process control monitors) provided on a semiconductor wafer is applied as shown in FIG. 9.

DC characteristics (current values) of semiconductor wafers can be evaluated by using PCMs; that is, when values measured by using PCMs are below specified values, wafers are judged as being defective (see JP-A No. 2002-257903).

However, in the evaluation method using PCMs, it is impossible to check for defects in AC characteristics such as SI faults (crosstalk faults and IR-DROP faults) and delay faults which tend to increase in recent years as design rules become finer. Besides, PCMs are provided at only several spots on semiconductor wafers, which makes it impossible to evaluate the finished quality of all the semiconductor integrated circuits on semiconductor wafers.

SUMMARY OF THE INVENTION

An object of the present invention is to provide a method for testing a semiconductor integrated circuit, in which all semiconductor integrate circuits on a semiconductor wafer can be tested for defects in AC characteristics such as SI faults (crosstalk faults and IR-DROP faults) and delay faults, and a method for verifying design rules.

To attain such an object, a method for testing a semiconductor integrated circuit according to a first aspect of the invention includes a procedure in which a scan path circuit provided to detect a degeneracy fault in a semiconductor integrated circuit is utilized, scan chains to be tested of the scan path circuit are brought to a state in which shift resistor operation can be effected, and therefore, defects in AC characteristics between the scan chains are detected.

According to such a configuration, it is possible to check for AC characteristics (frequency characteristics and delay faults) which cannot be determined by PCMs. Besides, it becomes possible to grasp the tendency of variations in vias' high resistance failures, slight leakage current, wiring capacity, and so on caused during its manufacture. Moreover, since existing scan path circuits are used, there is no need to use any measurement-only circuit and further, it becomes possible to check for the characteristics of all the semiconductor integrated circuits on the wafer.

A method for testing a semiconductor integrated circuit according to a second aspect of the invention corresponds to the method of testing a semiconductor integrated circuit described in the first aspect except that the semiconductor integrated circuit is tested for crosstalk as a defect in the AC characteristics between the scan chains to be tested of the scan path circuit. The method according to the second aspect includes steps of selecting the scan chains to be tested out of the scan path circuit, generating signals to be inputted to the selected scan chains to test for the effect of the crosstalk, bringing the selected scan chains to a shift resistor state in which shift resistor operation can be effected, and inputting the signals to the scan chains being in the shift resistor state to determine whether crosstalk occurs or not by comparing an expected value and values of signals outputted from scan-out terminals via the shift resistors of the scan chains.

According to such a configuration, when crosstalk has occurred, the signals outputted from the scan-out terminals do not correspond with the expected value, which makes it possible to determine that the crosstalk occurs.

A method for testing a semiconductor integrated circuit according to a third aspect of the invention corresponds to the method described in the second aspect except that the step of selecting the scan chains to be tested out of the scan path circuit includes selecting scan path circuits in close proximity based on layout information and selecting scan chains, which have a distance between interconnections which is the closest to the minimum distance between the interconnections specified by design rules of the semiconductor integrated circuit, out of the scan path circuit.

A method for testing a semiconductor integrated circuit according to a fourth aspect of the invention corresponds to the method described in the third aspect except that the step of generating the signals to be inputted to the selected scan chains to test for the effect of the crosstalk includes: changing a value recognized by a logic circuit as being "0" to a value recognized by the logic circuit as being "1" only at one of the scan chains to be tested; inputting a signal, which has a value recognized by the logic circuit as being "0" changed from a value recognized by the logic circuit as being "1", to the scan-in terminal of the scan chain after a lapse of a fixed time period; and during that time, generating a signal to be transmitted to input a value recognized by the logic circuit as being "0" to the scan-in terminal of the other scan chain.

According to such a configuration, when crosstalk has occurred, a glitch occurs at the other scan chain, so that the glitch fault resulting from the crosstalk can be detected.

A method for testing a semiconductor integrated circuit according to a fifth aspect of the invention corresponds to the method described in the third aspect except that the step of generating the signals to be inputted to the selected scan chains to test for the effect of crosstalk includes: changing a value recognized by the logic circuit as being "1" to a value recognized by the logic circuit as being "0" only at one of the scan chains to be tested; inputting a signal, which has value recognized by the logic circuit as being "1" changed from value recognized by the logic circuit as being "0", to the scan-in terminal of the scan chain after a lapse of a fixed time period; and during that time, generating a signal to be transmitted to input a value recognized by the logic circuit as being "1" to the scan-in terminal of the other scan chain.

According to such a configuration, when crosstalk has occurred, a drop occurs at the other scan chain, so that the drop fault resulting from the crosstalk can be detected.

A method for testing a semiconductor integrated circuit according to a sixth aspect of the invention corresponds to the method for testing a semiconductor integrated circuit according to the first aspect except that the semiconductor integrated circuit is tested for the IR drop of a power supply voltage supplied as a defect in the AC characteristics between the scan chains to be tested of the scan path circuit. The method includes steps of selecting the scan chains to be tested out of the scan path circuit, generating signals to be inputted to the selected scan chains to test for the effect of the IR drop, bringing the selected scan chains to the shift resistor state in which the shift resistor operation can be effected, and inputting the signals to the scan chains being in the shift resistor state and measuring the power supply voltage fed to the semiconductor integrated circuit to determine whether the voltage varies or not.

According to such a configuration, it is possible to test for the effect of the IR drop on the power supply voltage fed to the semiconductor integrated circuit.

A method for testing a semiconductor integrated circuit according to a seventh aspect of the invention corresponds to the method described in the sixth aspect except that the step of selecting the scan chains to be tested out of the scan path circuit includes selecting all the scan chains being in the shift resistor state and transmitting changing signals from the transistors of all the scan chains to the scan-in terminals of all the scan chains.

According to such a configuration, by, for example, concurrently inputting test patterns of "1→0→1" to the scan ins of all the scan chains during the shift resistor operation and by measuring variations in the power supply voltage at the semiconductor integrated circuit, it is possible to test for the effect of the IR drop.

A method for testing a semiconductor integrated circuit according to an eighth aspect of the invention corresponds to the method described in the sixth aspect except that the step of selecting the scan chains to be tested out of the scan path circuit includes selecting the scan chains out of the scan path circuit to which voltages are fed from a certain power supply of the semiconductor integrated circuit and transmitting changing signals from the transistors of the scan chains to the scan-in terminals of the scan chains.

According to such a configuration, it is possible to measure the IR drops in the power supply voltages fed to certain layout blocks of the semiconductor integrated circuit.

A method for verifying design rules according to a ninth aspect of the invention is a method for verifying design rules which is applied when a semiconductor integrated circuit having a scan path circuit is laid out. The method includes steps of selecting scan chains, which are the closest to those of the design rules of the semiconductor integrated circuit, based on layout information, laying out interconnections between flip-flops of the selected scan chains so as to bring the interconnections close to each other while providing the minimum spacing specified in the design rules in any given direction, generating signals to be inputted to the selected scan chains to test for the effect of crosstalk, bringing the selected scan chains to a shift resistor state in which shift resistor operation can be effected, and determining whether crosstalk occurs or not by inputting the signals to the scan chains being in the shift resistor state and by comparing an expected value and values of signals outputted from scan-out terminals via the shift resistors of the scan chains.

According to such a configuration, it becomes possible to check on whether the design rules applied to the layout of the semiconductor integrated circuit are appropriate as rules by which problems such as crosstalk and poor frequency characteristics are not caused when the semiconductor integrated circuit has been commercialized.

A method for verifying design rules according to a tenth aspect of the invention corresponds to the method described in the ninth aspect except that at the step of generating the signals to be inputted to the selected scan chains to test for the effect of the crosstalk, the method for testing a semiconductor integrated circuit described in the fourth or fifth aspect of the invention is used.

According to such a configuration, it is possible to secure the same effect as that described in the fourth or fifth aspect of the invention.

A method for testing a semiconductor integrated circuit according to an eleventh aspect of the invention corresponds to the method for testing a semiconductor integrated circuit described in the first aspect of the invention except that variations in delay time developed at the semiconductor integrated circuit are measured as a defect in the AC characteristics between the scan chains to be tested of the scan path circuit. The method includes steps of selecting the scan chain to be tested out of the scan path circuit, selecting a first path from the scan-in terminal of the scan chain to its scan-out terminal via all the flip-flops of the scan chain, forming a second path from the scan-in terminal of the first path to the scan-out terminal of the first path via the arbitrary number of flip-flops of the scan chain, bringing the selected scan chain to the shift resistor state in which the shift resistor operation can be effected, and measuring transition time taken for signals to be outputted from the first and second paths to the scan-out terminal in the shift resistor state to relatively measure the delay value of each path.

According to such a configuration, the variations in the delay time developed at the semiconductor integrated circuit can be measured by relatively measuring the delay value of each path.

DESCRIPTION OF THE EXEMPLARY EMBODIMENTS

Embodiments according to the present invention will be described below with reference to the drawings.

A first embodiment of the invention will be described with reference to FIGS. 1 to 4.

Figure 1:
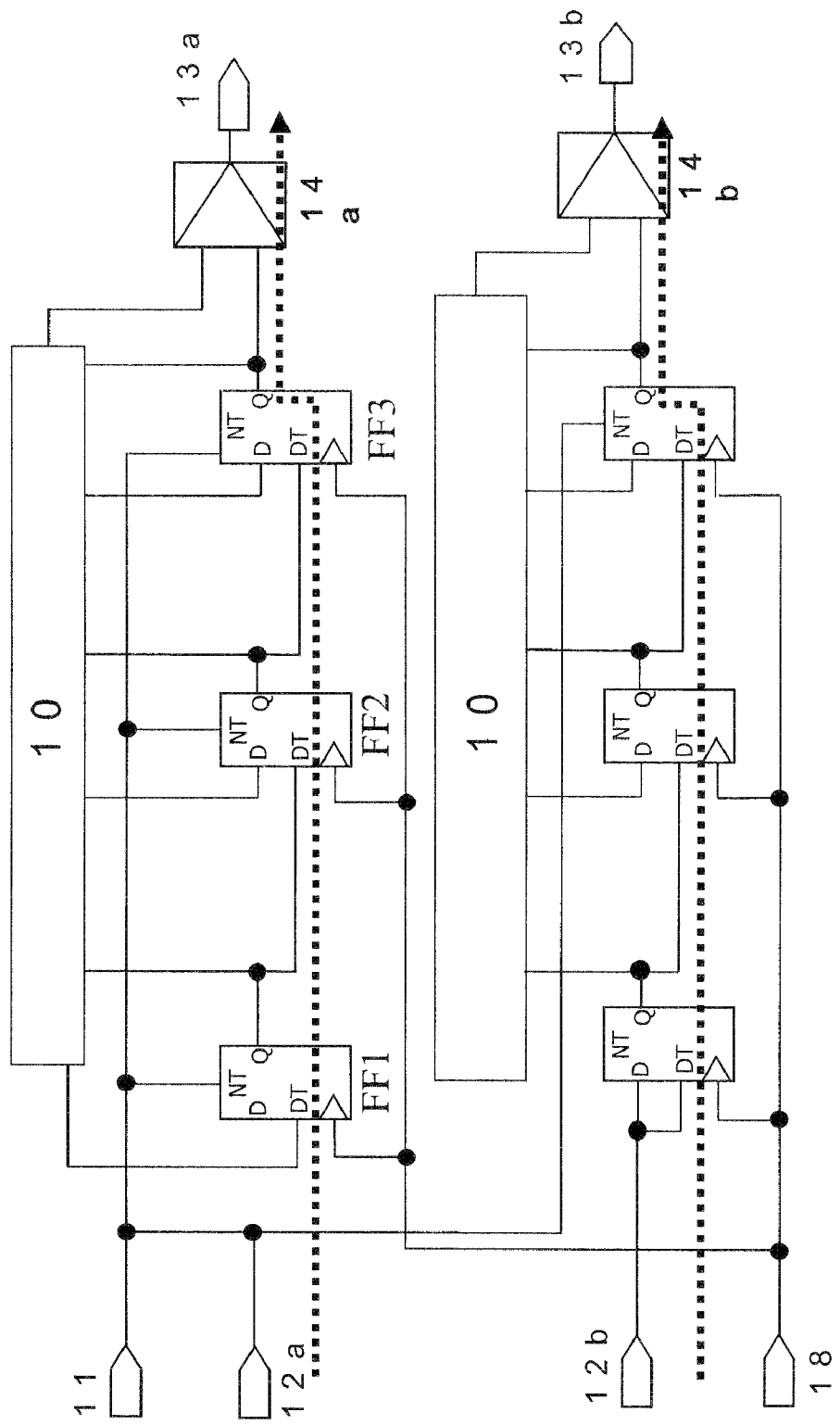
FIG. 1 is a circuit diagram showing an application of a method for testing a semiconductor integrated circuit according to a first embodiment of the present invention.

FIG. 1 is a circuit diagram showing shift resistor operations effected at a scan path circuit according the first embodiment of the invention.

In the first embodiment, a semiconductor integrated circuit having a scan path circuit will be tested for crosstalk. That is, the test includes steps of selecting scan chains 14a and 14b to be tested out of the scan path circuit, generating signals to be inputted to the selected scan chains for the check for the effect of crosstalk, bringing the selected scan chains to a shift resistor state in which shift resistor operation can be effected, and determining whether crosstalk occurs or not by inputting the signals to the scan chains being in the shift resistor state and by comparing an expected value and values of signals outputted from scan-out terminals 13a and 13b via the shift resistors of the scan chains.

In FIG. 1, reference numerals 10's denote combinational circuits, reference numeral 11 denotes a scan enable terminal, reference numerals 12a and 12b denote scan-in terminals, reference numeral 18 denotes a clock, and reference numerals FF1 to FF3 are flip-flops.

Figure 2:
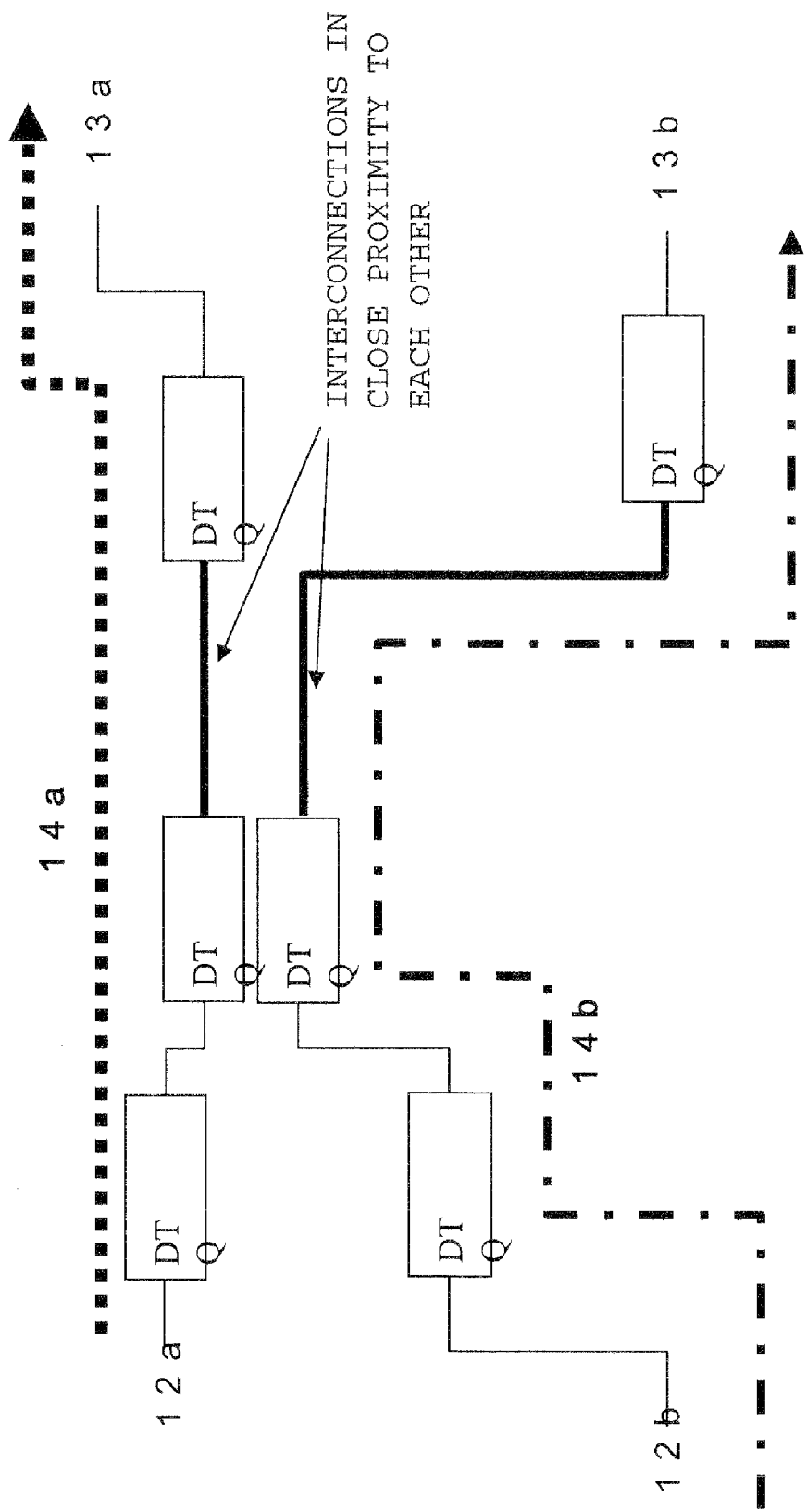
FIG. 2 is a block diagram schematically showing a method for forming patterns described in the first embodiment.

The scan path circuit is provided to the semiconductor integrated circuit having a logic circuit to detect logical failure in the semiconductor integrated circuit. The shift resistor operation represents an operation which comprises steps that a signal is inputted from the scan-in terminal (1)12a by enabling the scan enable terminal 11 of the scan path circuit, the signal is outputted to the Q terminal of the flip-flop FF1 via the DT terminal of the flip-flop FF1, the signal is inputted to the DT terminal of the flip-flop FF2, the signal inputted to the DT terminal of the flip-flop FF2 is outputted to the Q terminal of the flip-flop FF2, the signal outputted from the Q terminal is inputted to the DT terminal of the next flip-flop FF3, and the signal outputted from the Q terminal of the flip-flop FF3 is outputted to the scan-out terminal (1)13a. The scan chain (1)14a refers to the path from the scan-in terminal (1)12a to the scan-out terminal (1)13a being in the shift resistor state. Within the semiconductor integrated circuit, such a scan chain is present plurally. In the scan chains 14a and 14b, test patterns, which are used to detect crosstalk as shown in FIGS. 3 and 4, are inputted to both the scan chains (1)14a and (2)14b which are laid out in such a way that as shown in FIG. 2, an interconnection between the Q terminal of one of the scan flip-flops of the scan chain (1)14a and the DT terminal of the next scan flip-flop and an interconnection between the Q terminal of one of the scan flip-flops of the scan chain (2) 14b and the DT terminal of the next scan flip-flop are provided closest to each other.

That is, the step of selecting the scan chains to be tested out of the scan path circuit includes selecting scan path circuits in close proximity based on layout information and then selecting the scan chains (1)14a and (2)14b of the scan path circuit which have a distance between the interconnections which is the closest to the minimum distance between interconnections specified by the design rules of the semiconductor integrated circuit.

Figure 3:
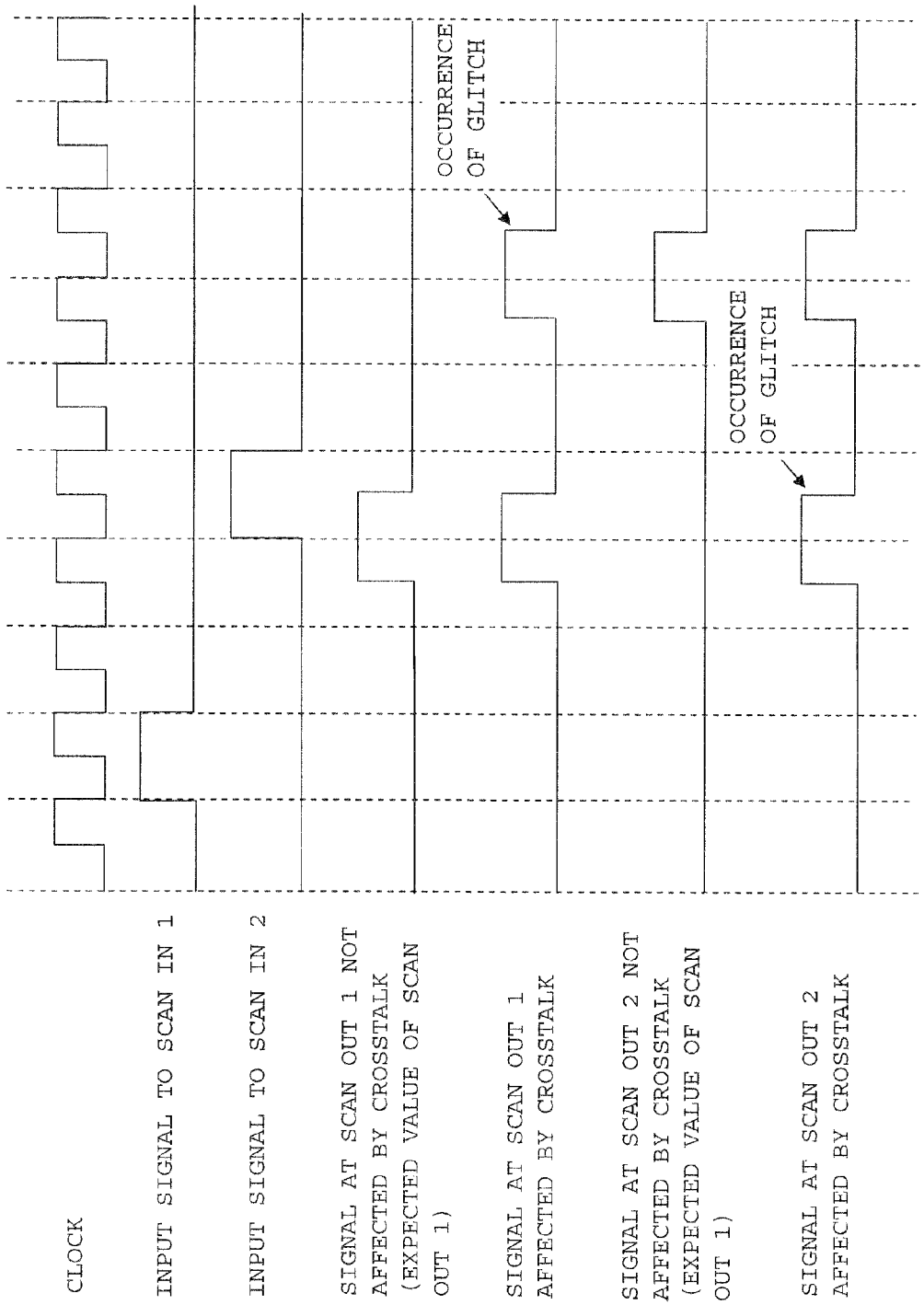
FIG. 3 is a schematic diagram of a pattern formed in the first embodiment.

In FIG. 3, the step of generating the signals to be inputted to the selected scan chains (1)14a and (2)14b to check for the effect of crosstalk includes: changing a value recognized by a logic circuit as being "0" to a value recognized by the logic circuit as being "1" only at one of the scan chains to be checked, i.e., only at the chain (1)14a; inputting a signal, which has the value recognized by the logic circuit as being "0" changed from the value recognized by the logic circuit as being "1", to the scan-in terminal (1)12a of the scan chain after a lapse of a fixed time period; and during that time, generating a signal to be transmitted to input a value recognized by the logic circuit as being "0" to the scan-in terminal (2)12b of the other scan chain (2)14b.

Figure 4:
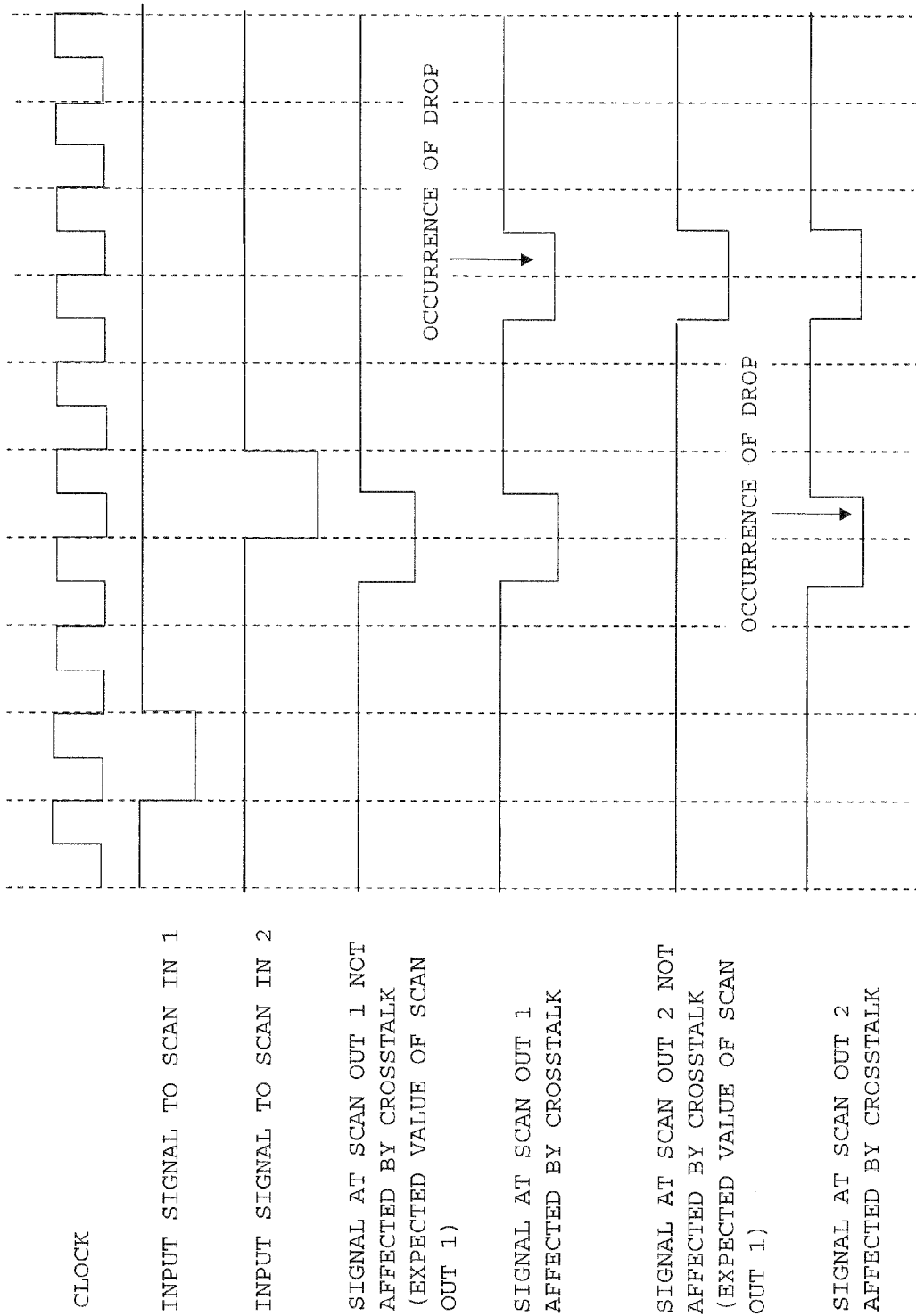
FIG. 4 is a schematic diagram of another pattern formed in the first embodiment.

In FIG. 4, the step of generating the signals to be inputted to the selected scan chains (1)14a and (2)14b to check for the effect of crosstalk includes: changing a value recognized by the logic circuit as being "1" to a value recognized by the logic circuit as being "0" only at one of the scan chains to be checked, i.e., only at the chain (1)14a; inputting a signal, which has the value recognized by the logic circuit as being "1" changed from the value recognized by the logic circuit as being "0", to the scan-in terminal (1)12a of the scan chain after a lapse of a fixed time period; and during that time, generating a signal to be transmitted to input a value recognized by the logic circuit as being "1" to the scan-in terminal (2)12b of the other scan chain (2)14b.

As this time, when crosstalk occurs between the interconnections of the scan chains (1)14a and (2)14b shown in FIG. 2, the values of signals outputted from the scan-out terminals (1)13a and (2)13b do not correspond with the expected value of the test pattern, which makes it possible to determine that the crosstalk occurs.

As a result, in FIG. 3, it is possible to detect the occurrence of a glitch between the scan chains resulting from the effect of crosstalk and in FIG. 4, it becomes possible to detect the occurrence of a drop between the scan chains resulting from the effect of crosstalk.

The crosstalk may occur due to not only the distance between the interconnections but a problem caused in the process of manufacturing the wiring layer of the semiconductor integrated circuit and can be detected by variations in a power supply voltage fed to the semiconductor integrated circuit and signal voltages fed to the scan-in terminals during the test and by varying the frequency of the test pattern. A voltage value and an operating frequency at which the crosstalk occurs vary with individual semiconductor integrated circuits on the semiconductor wafer. Therefore the tendencies of the characteristics of wiring capacity and slight leakage current can be determined by using such a method. Moreover, since the finished quality of the semiconductor integrated circuit is evaluated by changing its frequency, various characteristics such as frequency characteristics and delay characteristics can be determined.

A second embodiment according to the invention will be described with reference to FIGS. 5 and 6. The same components as those described in FIG. 1 are denoted with the same reference numerals.

In this embodiment, a semiconductor integrated circuit having a scan path circuit is tested for the IR drop of a power supply voltage fed thereto. That is, the test includes steps of selecting scan chains 14a to 14d to be tested out of the scan path circuit, generating signals to be inputted to the selected scan chains to check for the effect of the IR drop, bringing the selected scan chains to a shift resistor state in which shift resistor operation can be effected, and inputting the signals to the scan chains being in the shift resistor state and then measuring the power supply voltage fed to the semiconductor integrated circuit to determine whether a voltage varies or not.

In this case, during the shift resistor operation of the scan path circuit of the semiconductor integrated circuit, the transistors of the selected scan chains supply changing signals to all the scan ins (1) to (3) of the scan chains. That is, variations in the power supply voltage of the semiconductor integrated circuit are measured by concurrently inputting test patterns of "1→0→1" as shown in FIG. 5. By employing this method, it is possible to check on whether the effect of the IR drop is exerted or not.

Figure 5:
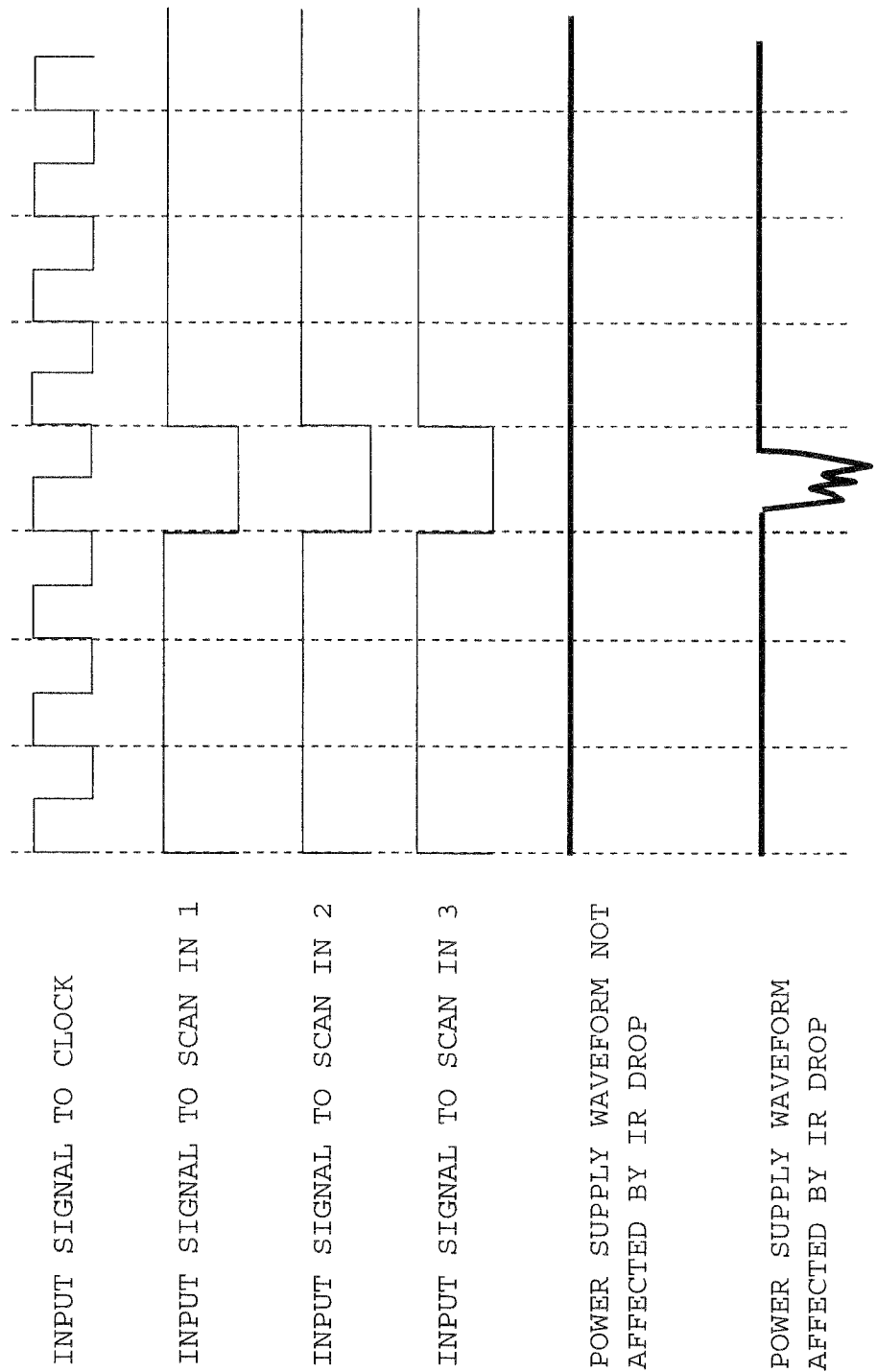
FIG. 5 is a schematic diagram of a pattern formed in a second embodiment.
Figure 6:
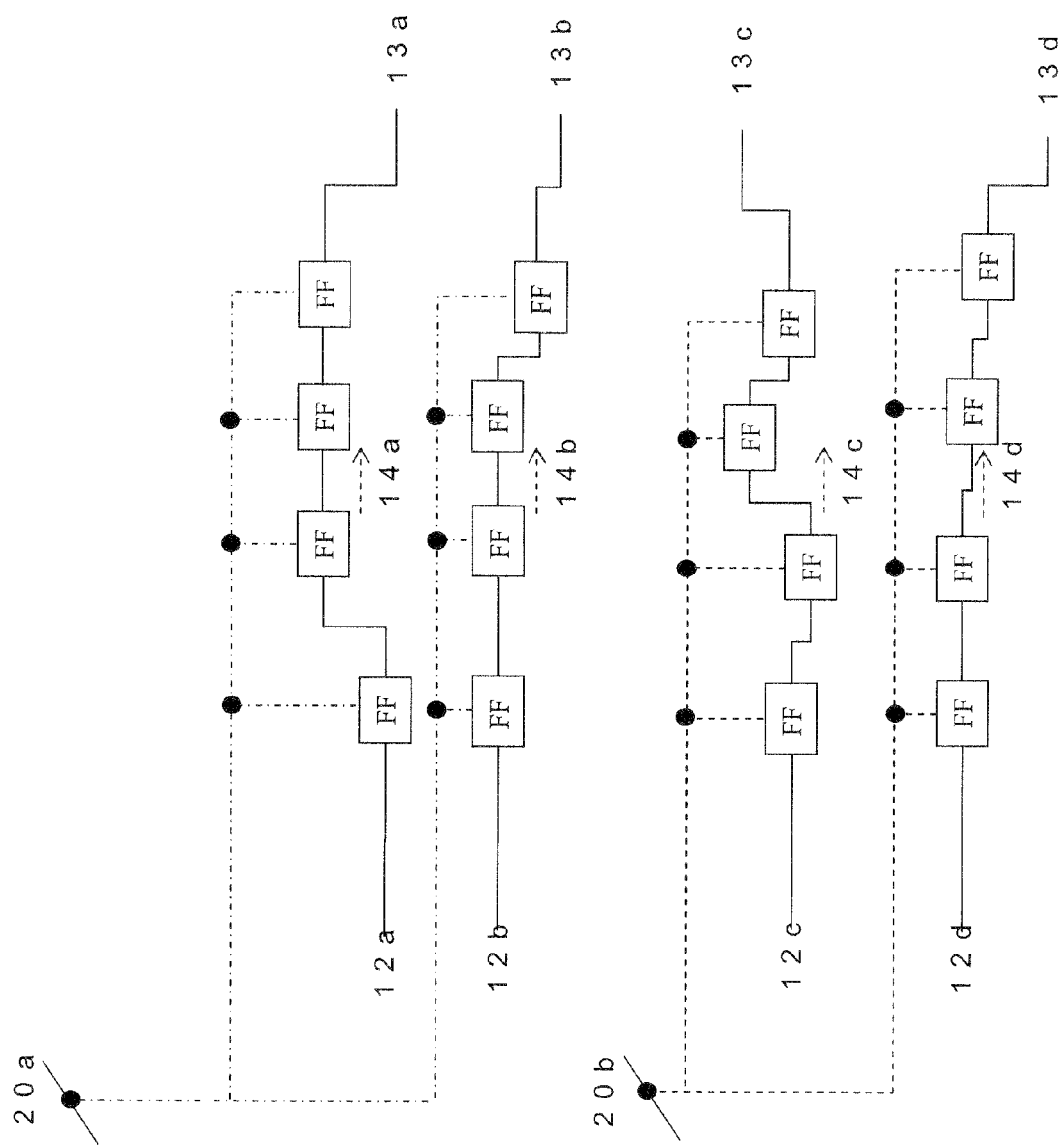
FIG. 6 is a block diagram schematically showing scan chains described in the second embodiment.

Moreover, to measure IR drops in power supply voltages (1)20a and (2)20b fed to certain layout blocks of the semiconductor integrated circuit as shown in FIG. 6, test patterns shown in FIG. 5 are inputted only to the scan ins (1)12a to (4)12d of the scan chains of the layout blocks and variations in the specified power supply voltages are measured, thereby it is possible to check whether the effect of the IR drops is exerted or not. Since the IR drops occur due to the effect of the resistance values of the interconnections, it becomes possible to check for variations in the resistance values of the interconnections caused in their formation by using the test method.

A third embodiment according to the invention will be described with reference to FIG. 7. The same components as those described in FIG. 1 are denoted with the same reference numerals.

This embodiment demonstrates a method for verifying design rules which are applied when the layout of a semiconductor integrated circuit having a scan path circuit is done. That is, the method includes steps of selecting the scan chains 14a and 14b which are the closest to those specified by the design rules of the semiconductor integrated circuit based on layout information, laying out interconnections between the flip-flops of the selected scan chains so as to bring the interconnections close to each other while providing the minimum spacing specified in the design rules in any given direction, generating signals to be inputted to the selected scan chains to check for the effect of crosstalk, bringing the selected scan chains to a shift resistor state in which shift resistor operation can be effected, and inputting the signals to the scan chains being in the shift resistor state and comparing an expected value and the values of signals outputted from the scan-out terminals 13a and 13b via the shift resistors of the scan chains to determine whether crosstalk occurs.

Figure 7:
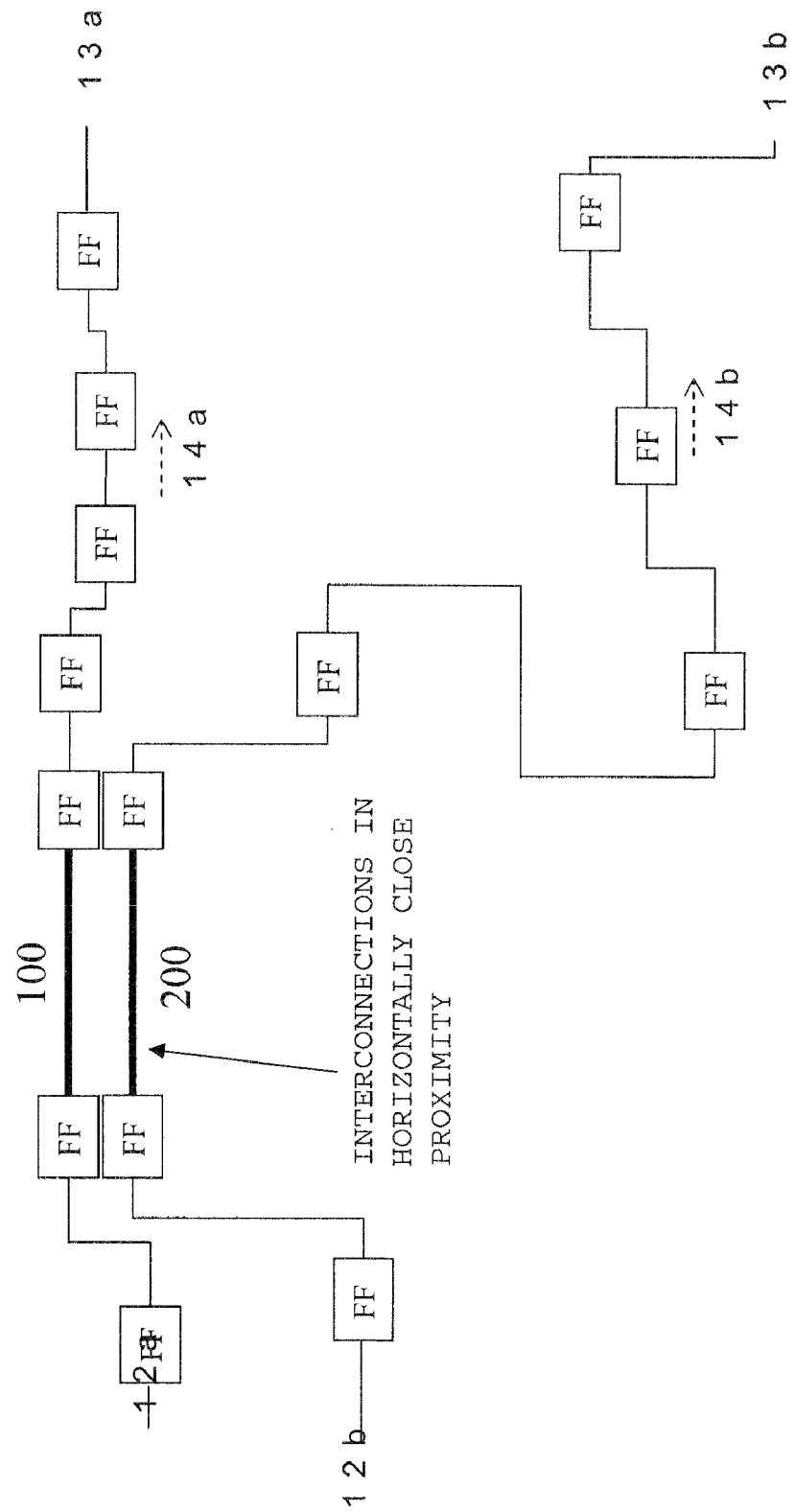
FIG. 7 is a block diagram schematically showing scan chains described in a third embodiment.

In this case, when the shift operation is effected at the scan path circuit in the semiconductor integrated circuit, an interconnection 100 between the scan flip-flops of the scan chain (1)14a and an interconnection 200 between the scan flip-flops of the scan chain (2)14b are laid out in such a way that both the interconnections are provided in parallel with each other intentionally horizontally as shown in FIG. 7. After doing such a layout, the test patterns shown in FIGS. 3 and 4 are inputted to the scan-in terminals (1)12a and (2)12b, and then, the values of the signals outputted from the scan-out terminals (1)13a and (2)13b are compared to the expected values of the test patterns by utilizing variations in a power supply voltage supplied to the semiconductor integrated circuit and signal voltages fed to the scan-in terminals and by varying the frequencies of the test patterns to check on whether the signal values correspond to the expected value, thereby a check for the occurrence of crosstalk is conducted. As a result, it becomes possible to check on whether design rules, which are applied when the layout of a semiconductor integrated circuit is done, are appropriate as rules by which problems such as crosstalk and poor frequency characteristics are not caused when the semiconductor integrated circuit has been commercialized. Besides, by providing the interconnections in not only the horizontal direction but any given direction such as a vertical direction, various design rules can be verified.

A fourth embodiment according to the invention will be described with reference to FIG. 8.

This embodiment demonstrates the measurement of variations in delay time which develops at a semiconductor integrated circuit having a scan path circuit. That is, the measurement includes steps of selecting a scan chain to be subjected to the measurement out of the scan path circuit, selecting a path (1)21a from the scan-in terminal 12 of the scan chain to its scan-out terminal 13 via all the flip-flops FF1 to FF6 if the scan chain, forming a path (2)21b from the scan-in terminal 12 of the path (1)21a to the scan-out terminal 13 of the path (1)21a via the arbitrary number of flip-flops of the scan chain, bringing the scan chain to a shift resistor state in which shift resistor operation can be effected, and measuring transition times taken for signals to be outputted from the paths (1)21a and (2)21b to the scan-out terminal 13 in the shift resistor state to relatively measure a delay value of each path.

Figure 8:
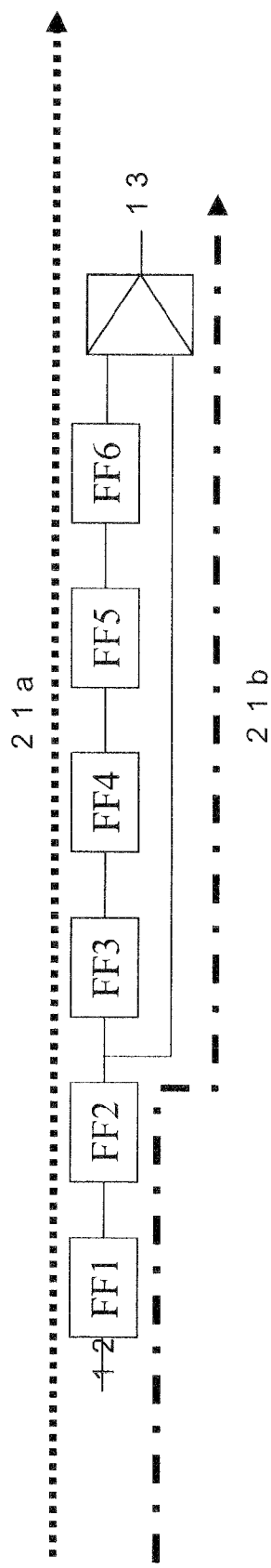
FIG. 8 is a block diagram schematically showing a scan chain described in a fourth embodiment.
Figure 9:
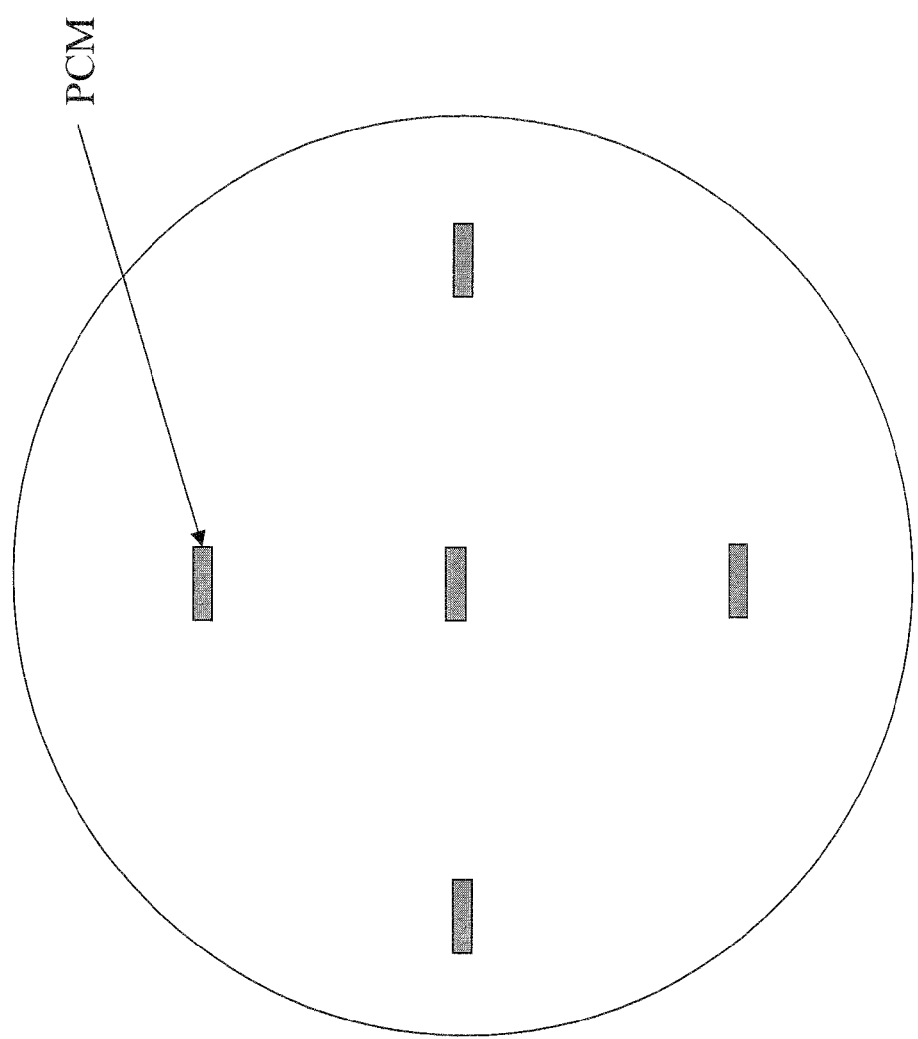
FIG. 9 is a schematic diagram of PCMs on a semiconductor wafer.

In this case, by measuring the transition times taken for the signals to be scanned out from both the path (1)21a from the scan-in terminal to the scan-out terminal via all the flip-flops FF1 to FF6 of the scan chain and the path (2)21b from the scan-in terminal 12 to the scan-out terminal 13 via the flip-flop FF2 of the scan chain of the scan path circuit being in the shift resistor state included in the semiconductor integrated circuit shown in FIG. 8, the delay values of the paths are measured relatively, which makes it possible to measure the variations in the delay time which develops at the semiconductor integrated circuit.

While the invention has been described above with reference to such embodiments, the invention is not limited to those embodiments and hence, it will be understood that many modifications and variations that could be made by those skilled in the art are included within the scope of the invention claimed.

What is claimed is:

1. A method for verifying design rules which are applied when a semiconductor integrated circuit having a scan path circuit is laid out, comprising:
    (a) selecting scan chains which are the closest to those of design rules of the semiconductor integrated circuit based on layout information;
    (b) laying out interconnections between flip-flops of the selected scan chains so as to bring the interconnections close to each other while providing the minimum spacing specified in the design rules in any given direction;
    (c) generating signals to be inputted to the selected scan chains to test for the effect of crosstalk;
    (d) bringing the selected scan chains to a shift resistor state in which shift resistor operation can be effected; and
    (e) determining whether crosstalk occurs or not by inputting the signals to the scan chains being in the shift resistor state and by comparing an expected value and values of signals outputted from scan-out terminals via the shift resistors of the scan chains.

2. A method for verifying design rules which are applied when a semiconductor integrated circuit having a scan path circuit is laid out, comprising:
    (a) selecting scan chains which are the closest to those of design rules of the semiconductor integrated circuit based on layout information;
    (b) laying out interconnections between flip-flops of the selected scan chains so as to bring the interconnections close to each other while providing the minimum spacing specified in the design rules in any given direction;
    (c) generating signals to be inputted to the selected scan chains to test for the effect of crosstalk;
    (d) bringing the selected scan chains to a shift resistor state in which shift resistor operation can be effected; and
    (e) determining whether crosstalk occurs or not by inputting the signals to the scan chains being in the shift resistor state and by comparing an expected value and values of signals outputted from scan-out terminals via the shift resistors of the scan chains, wherein:
    step (c) comprises a method for testing a semiconductor integrated circuit by utilizing a scan path circuit, which is provided to detect a degeneracy fault in the semiconductor integrated circuit, and bringing scan chains to be tested of the scan path circuit to a state in which shift resistor operation can be effected to detect defects in AC characteristics between the scan chains outside of combinational circuits,
    step (e) comprises testing the semiconductor integrated circuit for crosstalk as the defect in the AC characteristics between the scan chains to be tested of the scan path circuit by selecting the scan chains to be tested out of the scan path circuit; generating signals to be inputted to the selected scan chains to test for the effect of crosstalk; bringing the selected scan chains to a shift resistor state in which shift resistor operation can be effected; and determining whether crosstalk occurs or not by inputting the signals to the scan chains being in the shift resistor state and by comparing an expected value and values of signals outputted from scan-out terminals via the shift resistors of the scan chains, step (a) comprises selecting the scan chains to be tested out of the scan path circuit by selecting scan path circuits in close proximity based on layout information and selecting the scan chains of the scan path circuit which have a distance between interconnections which is the closest to the minimum distance between interconnections specified in design rules of the semiconductor integrated circuit, and step (c) further comprises generating the signals to be inputted to the selected scan chains to test for the effect of the crosstalk by changing a value recognized by a logic circuit as being "0" to a value recognized by the logic circuit as being "1" only at one of the scan chains to be tested, inputting a signal, which has the value recognized by the logic circuit as being "0" changed from the value recognized by the logic circuit as being "1", to the scan-in terminal of the scan chain after a lapse of a fixed time period, and during that time, generating a signal to be transmitted to input the value recognized by the logic circuit as being "0" to the scan-in terminal of the other scan chain.

3. A method for verifying design rules which are applied when a semiconductor integrated circuit having a scan path circuit is laid out, comprising:

(a) selecting scan chains which are the closest to those of design rules of the semiconductor integrated circuit based on layout information;

(b) laying out interconnections between flip-flops of the selected scan chains so as to bring the interconnections close to each other while providing the minimum spacing specified in the design rules in any given direction;

(c) generating signals to be inputted to the selected scan chains to test for the effect of crosstalk;

(d) bringing the selected scan chains to a shift resistor state in which shift resistor operation can be effected; and (e) determining whether crosstalk occurs or not by inputting the signals to the scan chains being in the shift resistor state and by comparing an expected value and values of signals outputted from scan-out terminals via the shift resistors of the scan chains, wherein:

step (c) comprises a method for testing a semiconductor integrated circuit including a plurality of scan chains comprising utilizing a scan path circuit, which is provided to detect a degeneracy fault in the semiconductor integrated circuit, and bringing scan chains to be tested of the scan path circuit to a state in which shift resistor operation can be effected to detect defects in AC characteristics between the scan chains outside of combinational circuits, step (e) comprises testing the semiconductor integrated circuit for crosstalk as the defect in the AC characteristics between the scan chains to be tested of the scan path circuit by selecting the scan chains to be tested out of the scan path circuit; generating signals to be inputted to the selected scan chains to test for the effect of crosstalk; bringing the selected scan chains to a shift resistor state in which shift resistor operation can be effected; and determining whether crosstalk occurs or not by inputting the signals to the scan chains being in the shift resistor state and by comparing an expected value and values of signals outputted from scan-out terminals via the shift resistors of the scan chains, step (a) comprises selecting the scan chains to be tested out of the scan path circuit by selecting scan path circuits in close proximity based on layout information and selecting the scan chains of the scan path circuit which have a distance between interconnections which is the closest to the minimum distance between interconnections specified in design rules of the semiconductor integrated circuit, and step (c) further comprises generating the signals to be inputted to the selected scan chains to test for the effect of the crosstalk by changing a value recognized by the logic circuit as being "1" to a value recognized by the logic circuit as being "0" only at one of the scan chains to be tested, inputting a signal, which has the value recognized by the logic circuit as being "1" changed from the value recognized by the logic circuit as being "0", to the scan-in terminal of the scan chain after a lapse of a fixed time period, and during that time, generating a signal to be transmitted to input the value recognized by the logic circuit as being "1" to the scan-in terminal of the other scan chain.

* * * * *